US012696471B2

(12) United States Patent
Chang et al.

(10) Patent No.: US 12,696,471 B2
(45) Date of Patent: Jul. 28, 2026

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Chun-Yi Chang, Taoyuan City (TW); Chia-Hui Lin, Taichung City (TW); Tai-Chun Huang, Hsin-Chu City (TW); Tze-Liang Lee, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 382 days.

(21) Appl. No.: 18/482,036

(22) Filed: Oct. 6, 2023

(65) Prior Publication Data

US 2025/0120109 A1     Apr. 10, 2025

(51) Int. Cl.
| | |
|---|---|
| *H01L 29/66* | (2006.01) |
| *H10D 30/01* | (2025.01) |
| *H10D 30/62* | (2025.01) |
| *H10D 62/10* | (2025.01) |
| *H10D 64/01* | (2025.01) |
| *H10D 84/01* | (2025.01) |
| *H10D 84/03* | (2025.01) |
| *H10D 84/83* | (2025.01) |

(52) U.S. Cl.
CPC .......... *H10D 30/024* (2025.01); *H10D 30/62* (2025.01); *H10D 62/115* (2025.01); *H10D 64/017* (2025.01); *H10D 84/0135* (2025.01); *H10D 84/0151* (2025.01); *H10D 84/0158* (2025.01); *H10D 84/038* (2025.01); *H10D 84/834* (2025.01)

(58) Field of Classification Search
CPC .... H10D 30/024; H10D 30/62; H10D 62/115; H10D 64/017; H10D 84/0135; H10D 84/0151; H10D 84/0158; H10D 84/038; H10D 84/834
See application file for complete search history.

(56) References Cited

U.S. PATENT DOCUMENTS

2021/0098594 A1*   4/2021   Chen ................... H10D 64/681

* cited by examiner

*Primary Examiner* — Jaehwan Oh
(74) *Attorney, Agent, or Firm* — WPAT LAW; Anthony King

(57) ABSTRACT

A semiconductor structure includes a metal gate structure and an isolation structure adjacent to the metal gate structure. The isolation structure includes a first dielectric layer, a second dielectric layer over the first dielectric layer and a third dielectric layer over the second dielectric layer. The first dielectric layer includes carbon of a first concentration, the second dielectric layer includes carbon of a second concentration, and the third dielectric layer includes carbon of a third concentration. The third concentration is greater than the second concentration, and the second concentration is greater than the first concentration.

20 Claims, 11 Drawing Sheets

SEMICONDUCTOR STRUCTURE AND METHOD FOR FORMING THE SAME

BACKGROUND

The electronics industry has experienced an ever-increasing demand for smaller and faster electronic devices that are able to support greater numbers of increasingly complex and sophisticated functions. Accordingly, there is a continuing trend in the semiconductor industry to manufacture low-cost, high-performance, low-power integrated circuits (ICs). Thus far these goals have been achieved in large part by scaling down semiconductor IC dimensions (e.g., minimum feature size) and thereby improving production efficiency and reducing associated costs. However, such downscaling has also introduced increased complexity to the semiconductor manufacturing process.

As technology nodes achieve progressively smaller scales, in some IC designs, researchers have hoped to replace a typical polysilicon gate with a metal gate to improve device performance by decreasing the feature sizes. One approach to forming the metal gate is called a "gate-last" approach, sometimes referred to as a replacement polysilicon gate (RPG) approach. In the RPG approach, the metal gate is fabricated last, which allows for a reduced number of subsequent operations.

Further, as dimensions of a transistor decrease, a thickness of a gate dielectric layer may be reduced to maintain performance with a decreased gate length. In order to reduce gate leakage, a high dielectric constant (high-k or HK) gate dielectric layer is used to provide a performance comparable to that provided by a typical gate oxide used in larger technology nodes. A high-k metal gate (HKMG) approach including a metal gate electrode and the high-k gate dielectric layer is therefore recognized. However, the HKMG approach is a complicated approach, and many issues arise.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
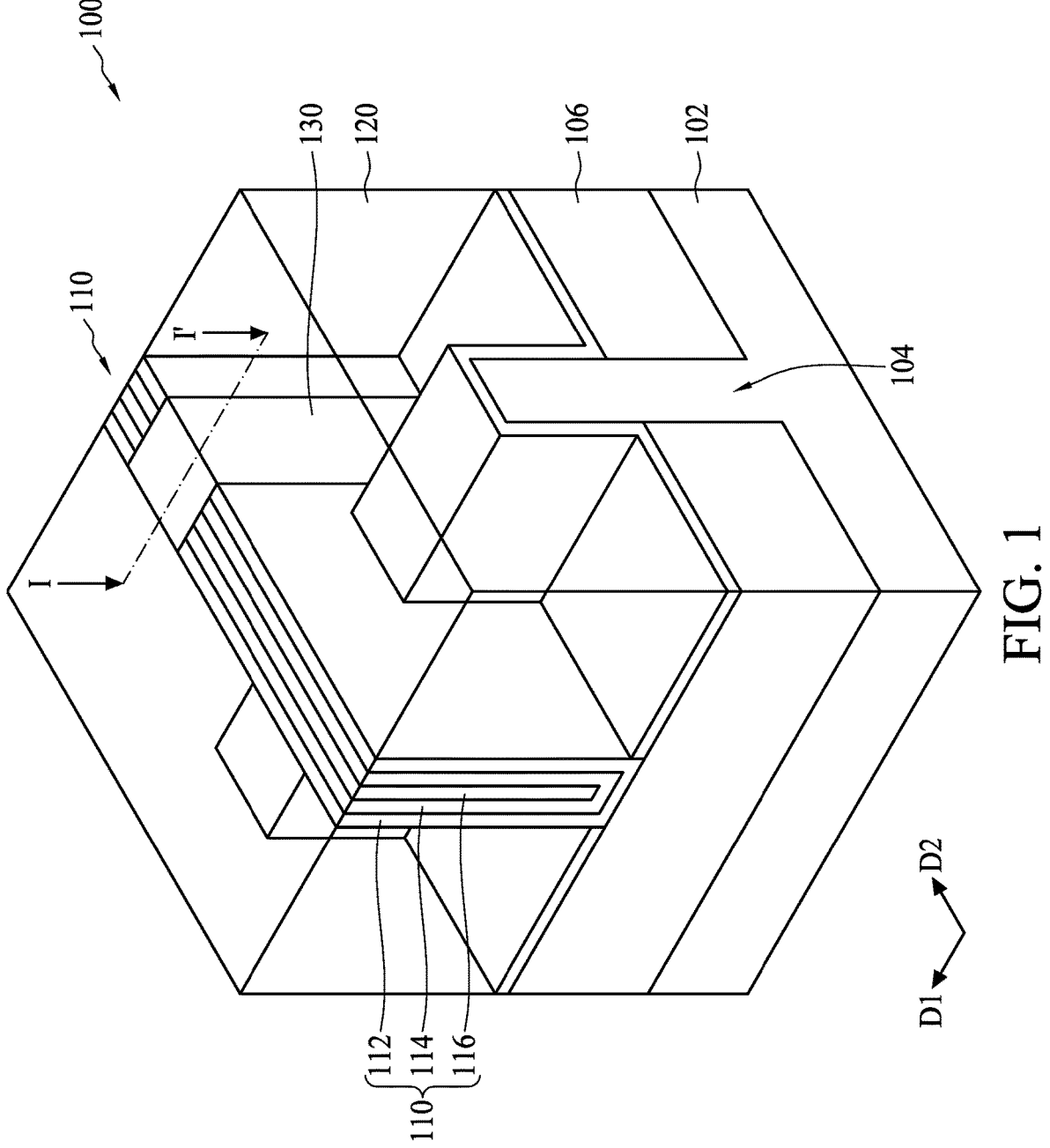
FIG. 1 is a perspective view illustrating portions of a semiconductor structure according to aspects of the present disclosure in one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of time, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Scaling down has increased complexity of processing and manufacturing ICs. As transistor scaling becomes ever more complex, performance benefits gained in front-end-of-line (FEOL) processes (i.e., transistors processes) can easily be lost if middle-end-of-line (MEOL) or back-end-of-line (BEOL) elements are not updated accordingly. For example, a MEOL cut metal gate (CMG) process is used to interrupt a continuous metal gate structure. The term "cut metal gate process" refers to a fabrication process in which after a metal gate feature (e.g., a high-k metal gate or HKMG) replaces a sacrificial gate structure (e.g., a polysilicon gate), the metal gate feature is cut (e.g., by an etching process) to separate the metal gate feature into two or more portions. Each portion functions as a metal gate structure for an individual transistor. An isolation material is subsequently deposited into trenches between adjacent metal gate structures. The trenches are referred to as cut metal gate trenches, or CMG trenches. Reduced dimensions also result in the elements having a reduced cross-sectional area, thereby increasing an effective capacitance (Ceff) of dielectric materials used to form an isolation in the CMG process. Both the reduced cross-sectional area and the increased effective capacitance result in increases in signal delay, referred to as resistance-capacitance (RC) delay.

According to one embodiment of the present disclosure, a semiconductor structure including a tri-layered isolation structure and a method thereof are provided. The semiconductor structure includes the tri-layered isolation structure implementing low-k materials in CMG operations. Further, the tri-layered isolation structure may be formed between conductive lines in a manner known as conductive connecting, in order to reduce Ceff, thereby reducing RC delay.

Figures 2, 3, 4:
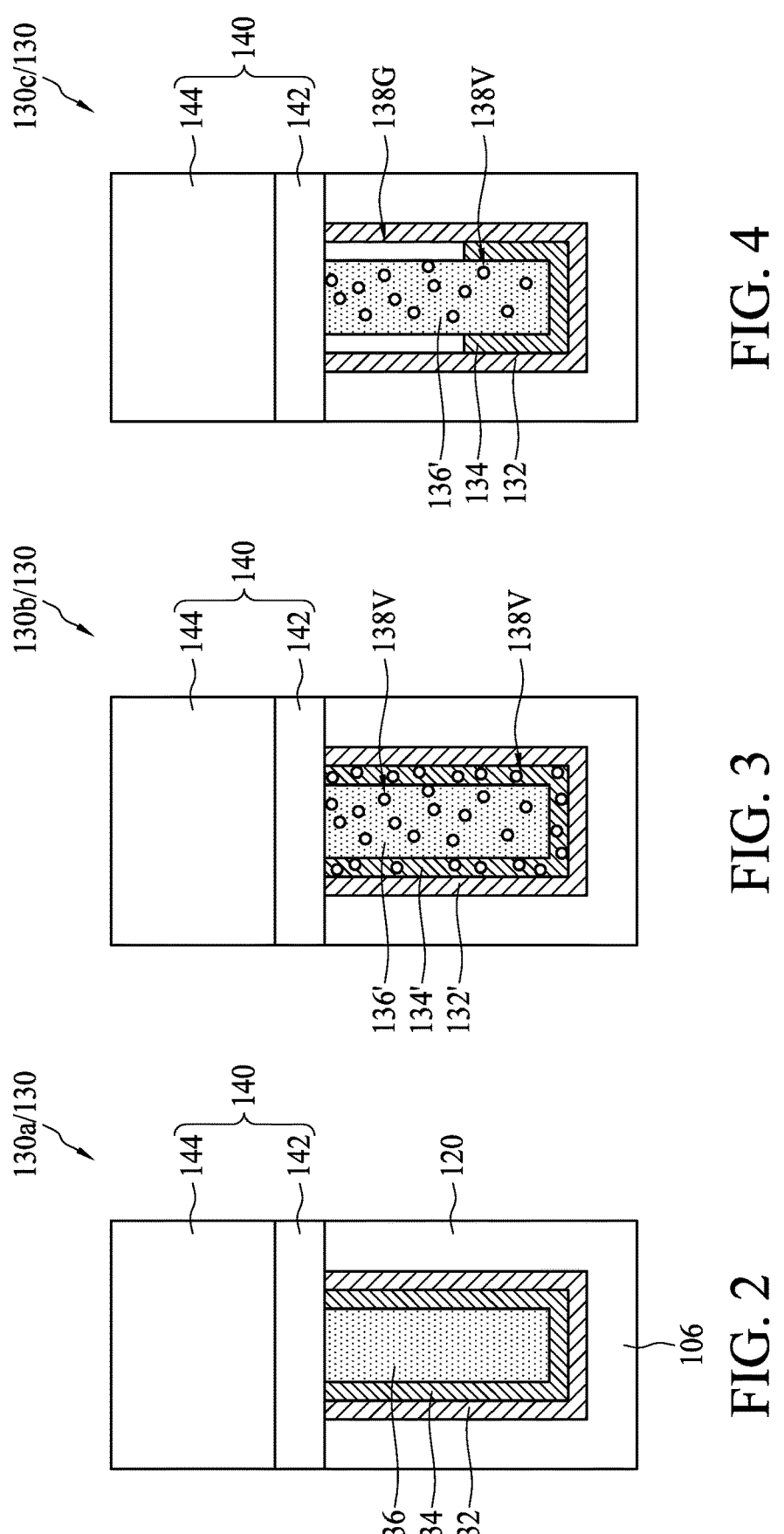
FIGS. 2 to 4 are cross-sectional views taken along a line I-I' of FIG. 1 according to various embodiments of the present disclosure.

FIG. 1 is a perspective view of a semiconductor structure according to aspects of the present disclosure, and FIGS. 2 to 4 are cross-sectional views of the semiconductor structure taken along line I-I' of FIG. 1 according to various embodiments. Referring to FIG. 1, the semiconductor structure 100 includes a substrate 102, at least a fin 104 protruding from the substrate 102, an isolation structure 106 over the substrate 102, and at least a metal gate structure 110 disposed over the fin 104 and the isolation structure 106. The semiconductor structure 100 further includes an isolation structure 120 surrounding the metal gate structure 110 and the fin 104. Further, the semiconductor structure 100 includes an isolation structure 130 disposed over the substrate 102 and adjacent to the metal gate structure 110. In some embodiments, the isolation structure 130 is disposed between two metal gate structures 110, and separates the metal gate structures 110 from each other.

In some embodiments, the substrate 102 may be a semiconductor substrate such as a silicon substrate. The substrate 102 may also include other semiconductors material such as germanium (Ge), silicon carbide (SiC), silicon germanium (SiGe), or diamond. Alternatively, the substrate 102 may include a compound semiconductor and/or an alloy semiconductor. The substrate 102 may include various layers, including conductive or insulating layers formed on a semiconductor substrate. The substrate 102 may include various doping configurations depending on design requirements, as is known in the art. For example, different doping profiles (e.g., n wells or p wells) may be formed on the substrate 102 in regions designed for different device types (e.g., n-type field-effect transistors (NFET), or p-type field-effect transistors (PFET)). A suitable doping operation may include ion implantation of dopants and/or diffusion processes.

The fin 104 includes one or more semiconductor materials such as Si, Ge, SiC, GaAs, GaP, InP, InAs, InSb, SiGe, GaAsP, AlInP, AlGaAs, GaInAs, GaInP, or GaInAsP. In some embodiments, the fin 104 may have alternately stacked layers of two different semiconductor materials, such as layers of Si and SiGe alternately stacked. The fin 104 may additionally include dopants for improving a performance of a FinFET device. For example, the fin 104 may include n-type dopant(s) such as phosphorus (P) or arsenic (As), or p-type dopant(s) such as boron (B) or indium (In).

The isolation structure 106 may include silicon oxide (SiO), silicon nitride (SiN), silicon oxynitride (SiON), fluoride-doped silicate glass (FSG), a low-k dielectric material, and/or other suitable insulating materials. The isolation structure 106 may include shallow trench isolation (STI) features. Other isolation structures, such as field oxide, local oxidation of silicon (LOCOS), and/or other suitable structures are possible. The isolation structure 106 may include a multi-layer structure, for example, a structure with one or more thermal oxide liner layers adjacent to the fin 104.

The metal gate structure 110 includes a high-k gate dielectric layer 112, a work function metal layer 114 over the high-k gate dielectric layer, and a gap-filling metal layer 116. In some embodiments, the metal gate structure 110 is also referred to as a high-k metal gate (or HKMG). The metal gate structure 110 may further include an interfacial layer (IL) (not shown) under the high-k gate dielectric layer 112.

The high-k gate dielectric layer 112 may include one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The work function metal layer 114 may include one or more metal layers. The work function metal layer 114 may be a p-type or an n-type work function layer depending on the type (PFET or NFET) of the device. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), and combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), titanium silicon nitride (TiSiN), and combinations thereof. The gap-filling metal layer 116 may include Al, W, cobalt (Co), and/or other suitable materials.

As shown in FIG. 1, the fin 104 extends in a first direction D1, and the metal gate structure 110 extends in a second direction D2. The second direction D2 is different from the first direction D1. Generally, the second direction D2 is perpendicular to the first direction D1. The metal gate structure 110 covers and engages the respective fin 104 to form an individual FinFET device. The two metal gate structures 110 separated by the isolation structure 130 have a same conductivity type. In some embodiments, the two metal gate structures 110 separated by the isolation structure 130 may have same materials. In some embodiments, the isolation structure 130 may be said to be disposed between two FinFET devices, and the two FinFET devices have a same conductive type.

Referring to FIGS. 2 to 4, various embodiments of the isolation structure 130 includes an isolation structure 130a, an isolation structure 130b and an isolation structure 130c. In some embodiments, the isolation structure 130a includes a first dielectric layer 132, a second dielectric layer 134, and a third dielectric layer 136, wherein the second dielectric layer 134 is between the first dielectric layer 132 and the third dielectric layer 136.

The first dielectric layer 132 may be in contact with the isolation structure 106. In some embodiments, the first dielectric layer 132 may be in contact with the isolation structure 120 along the first direction D1, and in contact with the metal gate structures 110 along the second direction D2. In some embodiments, a cross-sectional view of the first dielectric layer 132 has a U shape. A thickness of the first dielectric layer 132 may be between approximately 1 nanometer and approximately 3 nanometers, but the disclosure is not limited thereto. The first dielectric layer 132 includes a dielectric material. In some embodiments, the first dielectric layer 132 includes carbon. For example, the first dielectric layer 132 may include a silicon carbon nitride layer. In some embodiments, a carbon concentration of the first dielectric layer 132 is between approximately 5% and approximately 30%, but the disclosure is not limited thereto.

The second dielectric layer 134 is in contact with the first and third dielectric layers 132 and 136. In some embodiments, a cross-sectional view of the second dielectric layer 134 has a U shape. A thickness of the second dielectric layer 134 may be equal to the thickness of the first dielectric layer 132, but the disclosure is not limited thereto. In some embodiments, the second dielectric layer 134 includes a dielectric material same as that of the first dielectric layer 132. For example, the first dielectric layer 132 and the second dielectric layer 134 both may include a silicon carbon nitride layer. However, a carbon concentration in the second dielectric layer 134 is greater than the carbon concentration in the first dielectric layer 132. In some embodiments, the carbon concentration in the second dielectric layer 134 is greater than 30%, but the disclosure is not limited thereto. In other embodiments, the second dielectric layer 134 includes a dielectric material different from that of the first dielectric layer 132. For example, the second dielectric layer 134 may include a carbon layer.

The third dielectric layer 136 is disposed over the second dielectric layer 134. A thickness of the third dielectric layer 136 is greater than the thickness of the first dielectric layer 132 and greater than the thickness of the second dielectric layer 134. In some embodiments, the third dielectric layer 136 includes a dielectric material different from those of the first and second dielectric layers 132 and 134. However, the third dielectric layer 136 still includes carbon. For example, the third dielectric layer 136 includes a silicon carbon oxide layer. Further, a carbon concentration in the third dielectric layer 136 is greater than the carbon concentration in the first dielectric layer 132, and greater than the carbon concentration in the second dielectric layer 134. In some embodiments, the carbon concentration in the third dielectric layer 136 is between approximately 50% and approximately 60%, but the disclosure is not limited thereto.

It is known that a dielectric constant (also known as a k value) of silicon oxide is about 3.9, a dielectric constant of silicon nitride is about 7, and a dielectric constant of carbon is about 2. As a result, the dielectric constants of silicon oxide and silicon nitride may be reduced by addition of carbon. Accordingly, when the first dielectric layer 132 includes silicon carbon nitride and the second dielectric layer 134 includes silicon carbon nitride, such dielectric layers 132 and 134 have dielectric constants less than that of a silicon nitride layer; similarly, when third dielectric layer 136 includes silicon carbon oxide, such layer 136 has a dielectric constant less than that of a silicon oxide layer. Accordingly, the first dielectric layer 132, the second dielectric layer 134 and the third dielectric layer 136 form a tri-layered isolation structure 130a, and a dielectric constant of the tri-layered isolation structure 130a is reduced, thereby reducing Ceff and mitigating an RC delay issue.

Referring to FIG. 3, in some embodiments, the isolation structure 130b includes a first dielectric layer 132, a porous second dielectric layer 134', and a porous third dielectric layer 136', wherein the porous second dielectric layer 134' is between the first dielectric layer 132 and the porous third dielectric layer 136'.

The first dielectric layer 132 in the isolation structure 130b is similar to the dielectric later 132 in the isolation structure 130a; thus, repeated descriptions are omitted in the interest of brevity.

The porous second dielectric layer 134' is in contact with the first dielectric layer 132 and the porous third dielectric layer 136'. In some embodiments, the porous second dielectric layer 134' has a U shape in a cross-sectional view. A thickness of the porous second dielectric layer 134' may be equal to the thickness of the first dielectric layer 132, but the disclosure is not limited thereto. In some embodiments, the porous second dielectric layer 134' includes a dielectric material same as that of the first dielectric layer 132. For example, the porous second dielectric layer 134' may include a silicon carbon nitride layer. However, a plurality of voids 138V are formed in the porous second dielectric layer 134'.

The porous third dielectric layer 136' is disposed over the porous second dielectric layer 134'. A thickness of the porous third dielectric layer 136' is greater than the thickness of the first dielectric layer 132 and greater than the thickness of the porous second dielectric layer 134'. In some embodiments, the porous third dielectric layer 136' includes a dielectric material different from those of the first dielectric layer 132 and the porous second dielectric layer 134'. For example, the porous third dielectric layer 136' includes a silicon carbon oxide layer. Further, a plurality of voids 138V are formed in the porous third dielectric layer 136'.

As mentioned above, the dielectric constants of silicon oxide and silicon nitride may be reduced by addition of carbon. Accordingly, the first dielectric layer 132 and the porous second dielectric layer 134' that include silicon carbon nitride have dielectric constants less than that of a silicon nitride layer, and the porous third dielectric layer 136' that includes silicon carbon oxide has a dielectric constant less than that of a silicon oxide layer. Further, a dielectric constant of air is approximately 1. Therefore, the dielectric constants of the porous second dielectric layer 134' and the porous third dielectric layer 136' are further reduced due to the voids 138V. Accordingly, the first dielectric layer 132, the porous second dielectric layer 134', the porous dielectric layer 136', and the voids 138V in the porous second and porous third dielectric layers 134' and 136' form a tri-layered hybrid isolation structure 130b, and a dielectric constant of the tri-layered hybrid isolation structure 130b is further reduced, thereby reducing Ceff and mitigating the RC delay issue.

Referring to FIG. 4, in some embodiments, the isolation structure 130c includes a first dielectric layer 132, a second dielectric layer 134, and a porous third dielectric layer 136', wherein the second dielectric layer 134 is between the first dielectric layer 132 and the porous third dielectric layer 136'.

The first dielectric layer 132 in the isolation structure 130c is similar to that in the isolation structure 130a; thus, repeated descriptions are omitted in the interest of brevity.

The second dielectric layer 134 is in contact with the first and the porous third dielectric layers 132 and 136'. A thickness of the porous second dielectric layer 134 may be equal to the thickness the first dielectric layer 132, but the disclosure is not limited thereto. In some embodiments, the second dielectric layer 134 includes a dielectric material different from the dielectric material of the first dielectric layer 132. For example, the second dielectric layer 134 may include a carbon layer. In some embodiments, a cross-sectional view of the second dielectric layer 134 has a U shape in a cross-sectional view. Further, topmost portions of the second dielectric layer 134 are lower than topmost portions of the first dielectric layer 132 and lower than topmost portions of the porous third dielectric layer 136', as shown in FIG. 4.

The porous third dielectric layer 136' is disposed over the second dielectric layer 134. The porous third dielectric layer 136' is similar to the porous third dielectric layer 136' in the isolation structure 130b; thus, repeated descriptions are omitted in the interest of brevity.

In some embodiments, the semiconductor structure 100 further includes an isolation structure 140 disposed over the isolation structures 130a, 130b and 130c. In some embodiments, an air gap 138G is sealed by the isolation structure 140 and the isolation structure 130c. For example, the air gap 138G is sealed by the first dielectric layer 132, the second dielectric layer 134, the porous third dielectric layer 136' and the isolation structure 140. As shown in FIG. 4, the first dielectric layer 132 and the porous third dielectric layer 136' form sidewalls of the air gap 138G, the second dielectric layer 134 forms a bottom of the air gap 138G, and the isolation structure 140 forms a cap of the air gap 138G.

In some embodiments, the isolation structure 140 includes a dielectric layer 142 and a dielectric layer 144 over the dielectric layer 142. The dielectric layer 142 and the dielectric layer 144 may include different materials. For example, the dielectric layer 142 may include silicon nitride, while the dielectric layer 144 may include silicon oxide, but the disclosure is not limited thereto. In some embodiments, a thickness of the dielectric layer 142 is less than a thickness of the dielectric layer 144, but the disclosure is not limited thereto.

As mentioned above, the dielectric constants of silicon oxide and silicon nitride may be reduced by addition of carbon. Accordingly, the first dielectric layer 132 that includes silicon carbon nitride has a dielectric constant less than that of a silicon nitride layer, the second dielectric layer 134 that includes carbon has a dielectric constant less than that of a silicon nitride layer, and the porous third dielectric layer 136' that includes silicon carbon oxide has lower dielectric constant than that of a silicon oxide layer. Further, the first dielectric layer 132, the second dielectric layer 134, the porous third dielectric layer 136', the voids 138V in the porous third dielectric layer 136', and the air gap 138G form a tri-layered hybrid isolation structure 130c, and a dielectric constant of the tri-layered hybrid isolation structure 130c is reduced by the air gap 138G and the voids 138V, thereby further reducing Ceff and mitigating the RC delay issue.

Figure 5:
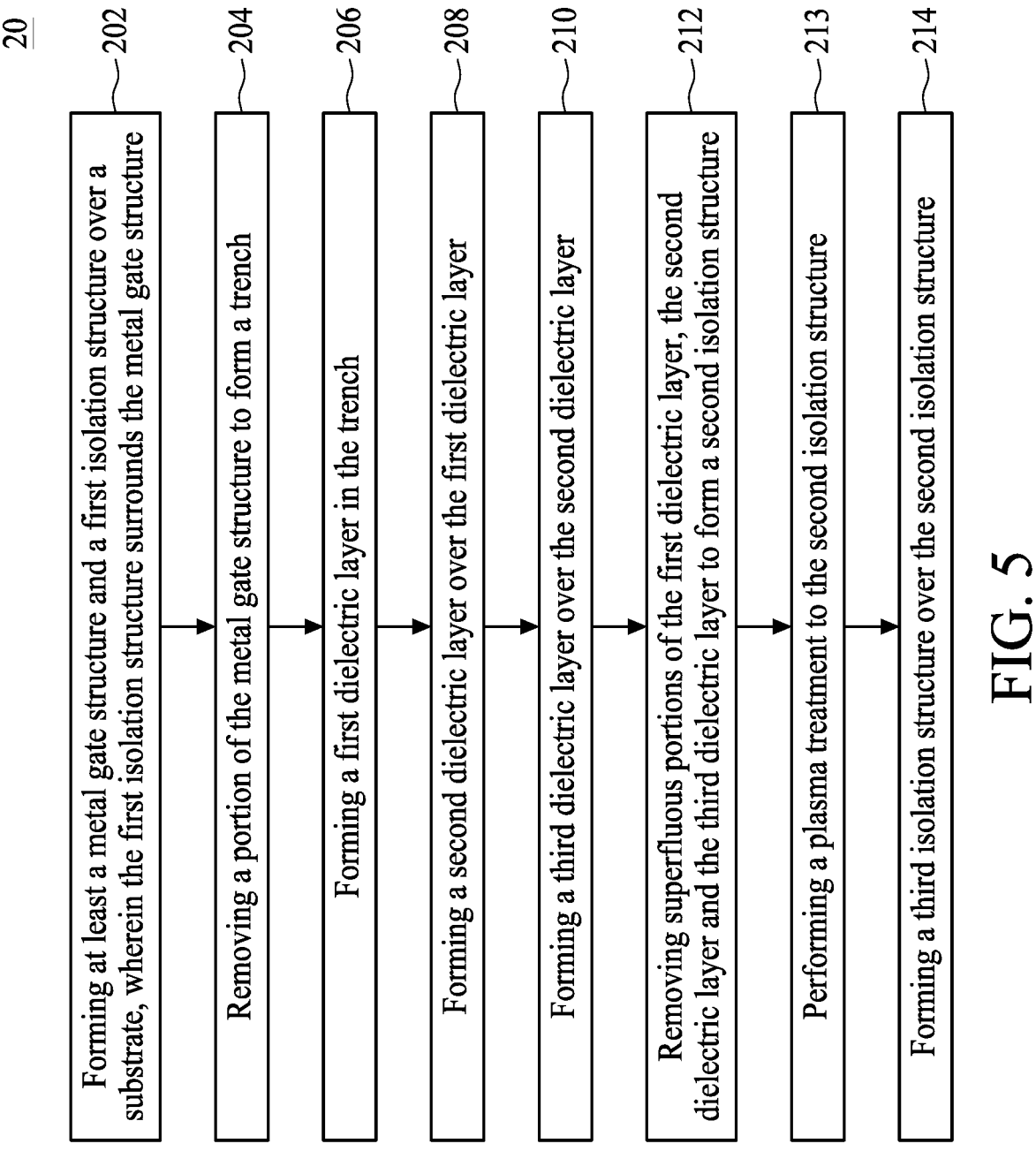
FIG. 5 is a flowchart representing a method for forming a semiconductor structure according to aspects of the present disclosure.

FIG. 5 is a flowchart representing a method 20 for forming a semiconductor structure according to aspects of one or more embodiments of the present disclosure. While the disclosed method 20 is illustrated and described herein as a series of acts or operations, it will be appreciated that an order of the illustrated acts or operations is not to be interpreted in a limiting sense. For example, some operations may be performed in a different order and/or concurrently with other acts or operations apart from those illustrated and/or described herein. In addition, not all illustrated operations may be required to implement one or more aspects or embodiments of the invention described herein. Further, one or more of the operations described herein may be carried out in one or more separate operations and/or phases.

Figure 6:
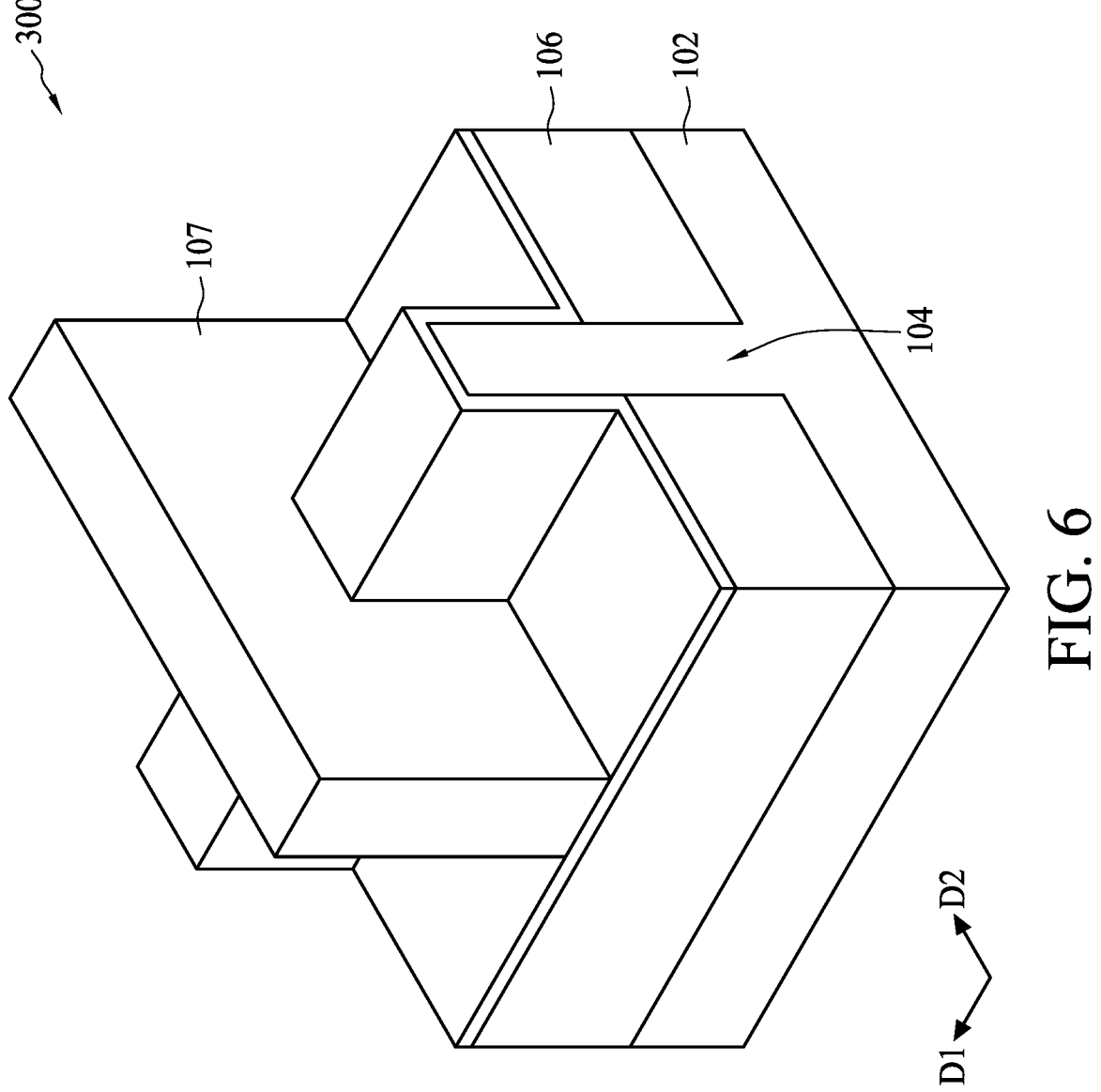
FIGS. 6 to 8 and 9A are perspective views at various stages in the method for forming a semiconductor structure according to aspects of the present disclosure.
Figure 7:
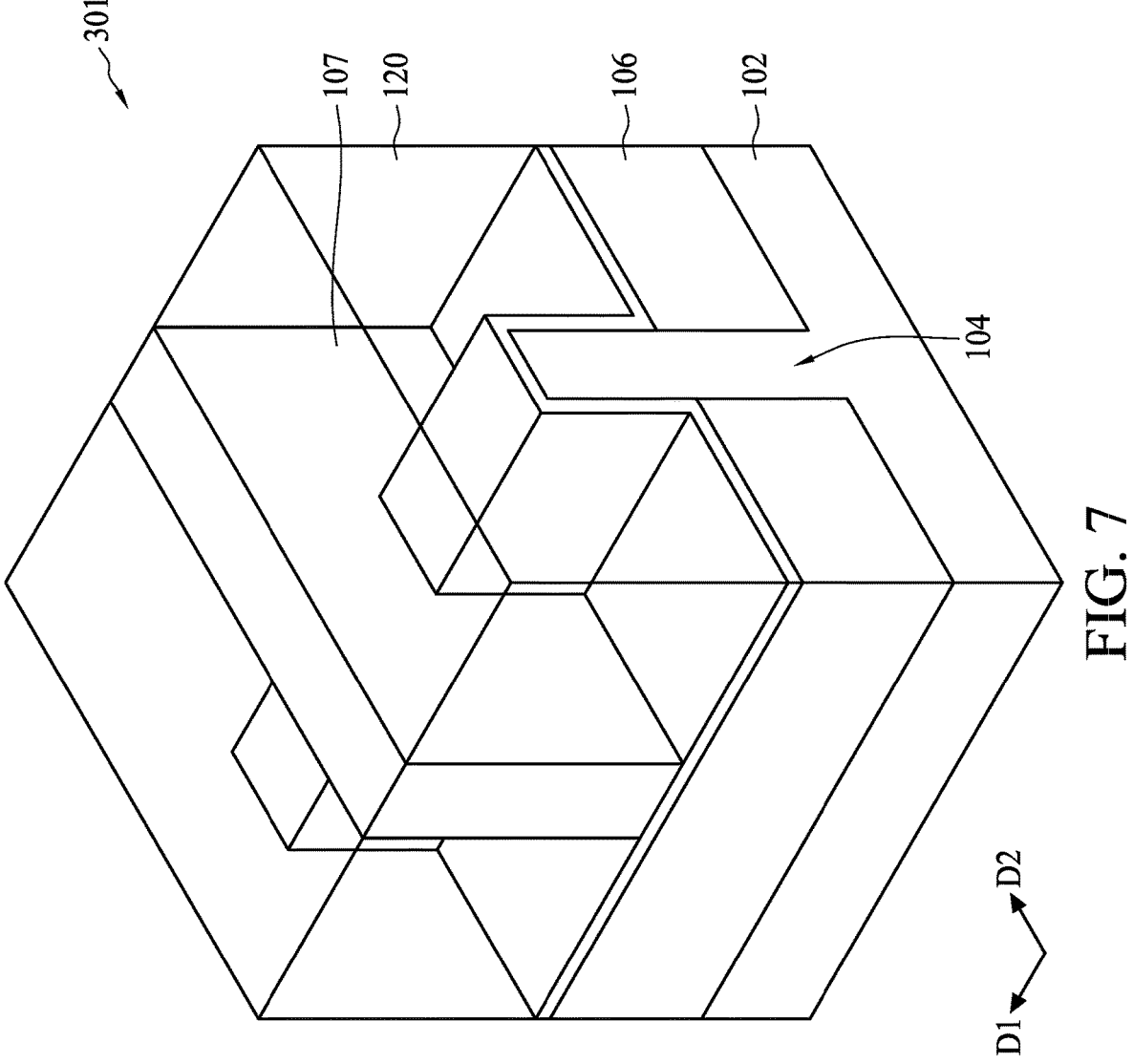
Figure 8:
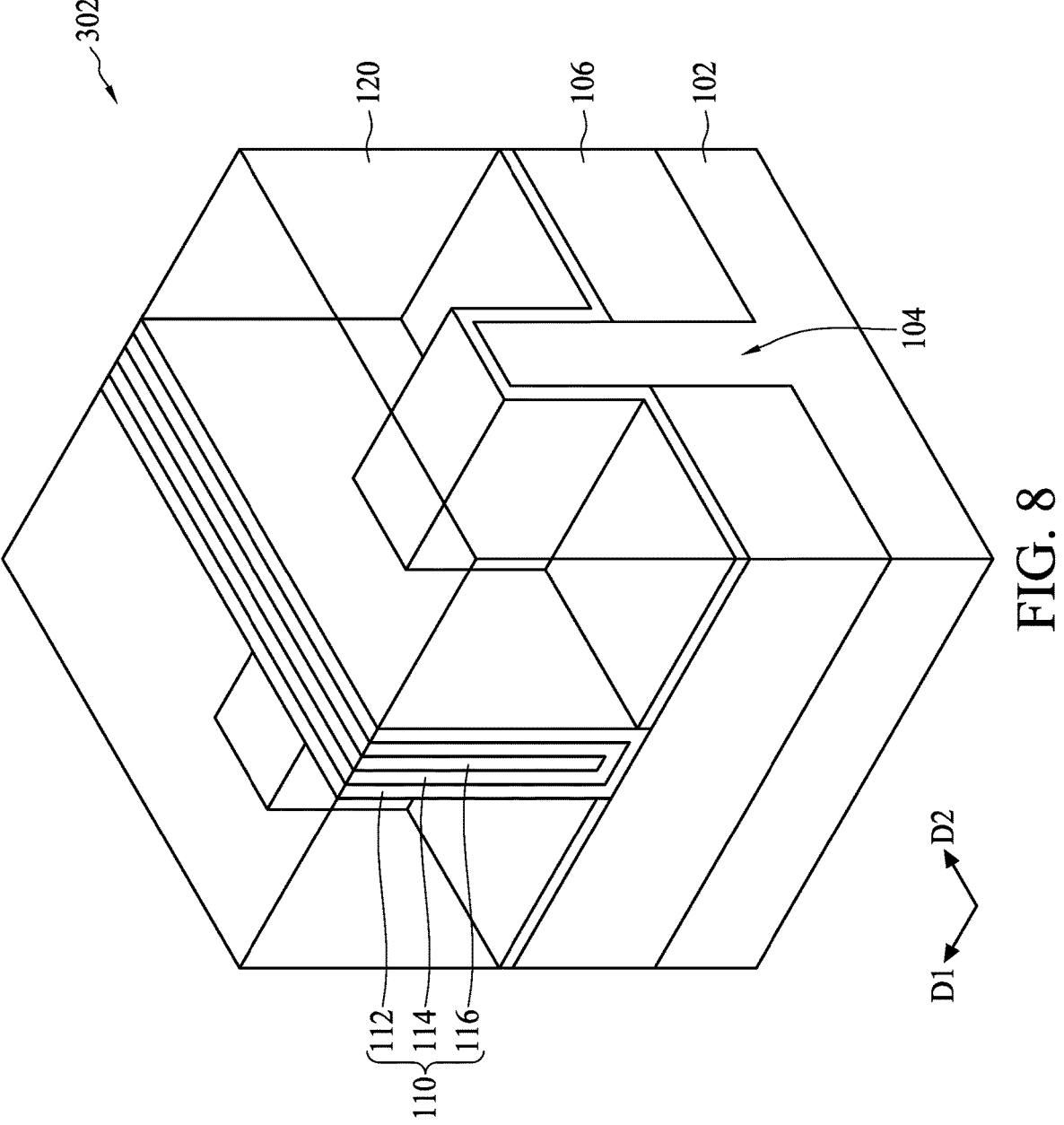

In operation 202, a metal gate structure is formed over a substrate. FIGS. 6 to 8 are perspective views of intermediate semiconductor structures 300 to 302 according to some embodiments corresponding to operation 202. In some embodiments, the operation 201 may include further steps. For example, as shown in FIG. 6, a substrate 102 is received, and a FET device may be formed over the substrate 102. In some embodiments, the FET device includes a fin structure 104a, a sacrificial gate 107, a spacer (not shown) and a source/drain (not shown). A portion of the fin 104 covered by the sacrificial gate 107 serves as a channel region. An isolation structure 106 is formed in the substrate 102 to surround a portion of the fin 104.

In some embodiments, the sacrificial gate 107 may include a dielectric layer and a sacrificial semiconductor layer. In some embodiments, the sacrificial semiconductor layers is made of polysilicon, but the disclosure is not limited thereto. In some embodiments, the spacer can be formed over sidewalls of the sacrificial gate 107. In some embodiments, the spacer is made of silicon nitride (SiN), silicon carbide (SiC), silicon oxide (SiO), silicon oxynitride (SiON), silicon carbide or any other suitable material, but the disclosure is not limited thereto. In some embodiments, the spacer is formed by deposition and etch-back operations.

In some embodiments, a source/drain is formed over the fin 104 at two opposite sides of the sacrificial gate 107. (As used herein, the term "source/drain" may refer to a source or a drain, individually or collectively depending upon the context.) In some embodiments, a height of the source/drain may be greater than a height of the fin 104. In some embodiments, the source/drain may be formed by forming recesses in the fin 104 and growing a strained material in the recesses by an epitaxial (epi) process. In addition, a lattice constant of the strained material may be different from a lattice constant of the fin 104. Accordingly, the source/drain may serve as stressors that improve carrier mobility.

Referring to FIG. 7, in some embodiments, after the forming of the source/drain, an isolation structure 120 is formed over the substrate 102. The isolation structure 120 may include a contact etch stop layer (CESL) and an interlayer dielectric (ILD) layer, though not shown. In some embodiments, the CESL can include silicon nitride, silicon oxynitride, and/or other applicable materials. The ILD structure may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon-doped silicon oxide, amorphous fluorinated carbon, parylene, bis-benzocyclobutenes (BCB), or polyimide. In some embodiments, a top surface of the sacrificial gate 107 is exposed through the isolation structure 120, as shown in FIG. 7.

Subsequently, a gate trench (not shown) is formed by removing the sacrificial gate 107. Referring to FIG. 8, a high-k dielectric layer 112 is formed in the gate trench. In some embodiments, an IL layer may be formed prior to the forming of the high-k dielectric layer 112, though not shown. The IL layer may include an oxide-containing material such as SiO or SiON. In some embodiments, the IL layer covers portions of the fin 104 exposed in the gate trench. The high-k dielectric layer 112 is conformally formed in the gate trench. Still referring to FIG. 8, a work function metal layer 114 is subsequently formed in the gate trench. The work function metal layer 114 may be formed by CVD, PVD and/or other suitable process. Subsequently, the gate trench is filled with a gap-filling metal layer 116. The gap-filling metal layer 116 may include metal materials having low resistance, and may be formed by CVD, PVC, plating and/or other suitable processes. Materials for forming the high-k gate dielectric layer 112, the work function metal layer 114 and the gap-filling metal layer 116 are similar to those described above; therefore, repeated descriptions are omitted in the interest of brevity. Further, a CMP is performed to remove superfluous layers, thereby forming a metal gate structure 110 surrounded by the isolation structure 120. As shown in FIG. 8, a top surface of the isolation structure 120 and a top surface of the metal gate structure 110 are aligned or level with each other.

Figures 9A, 9B:
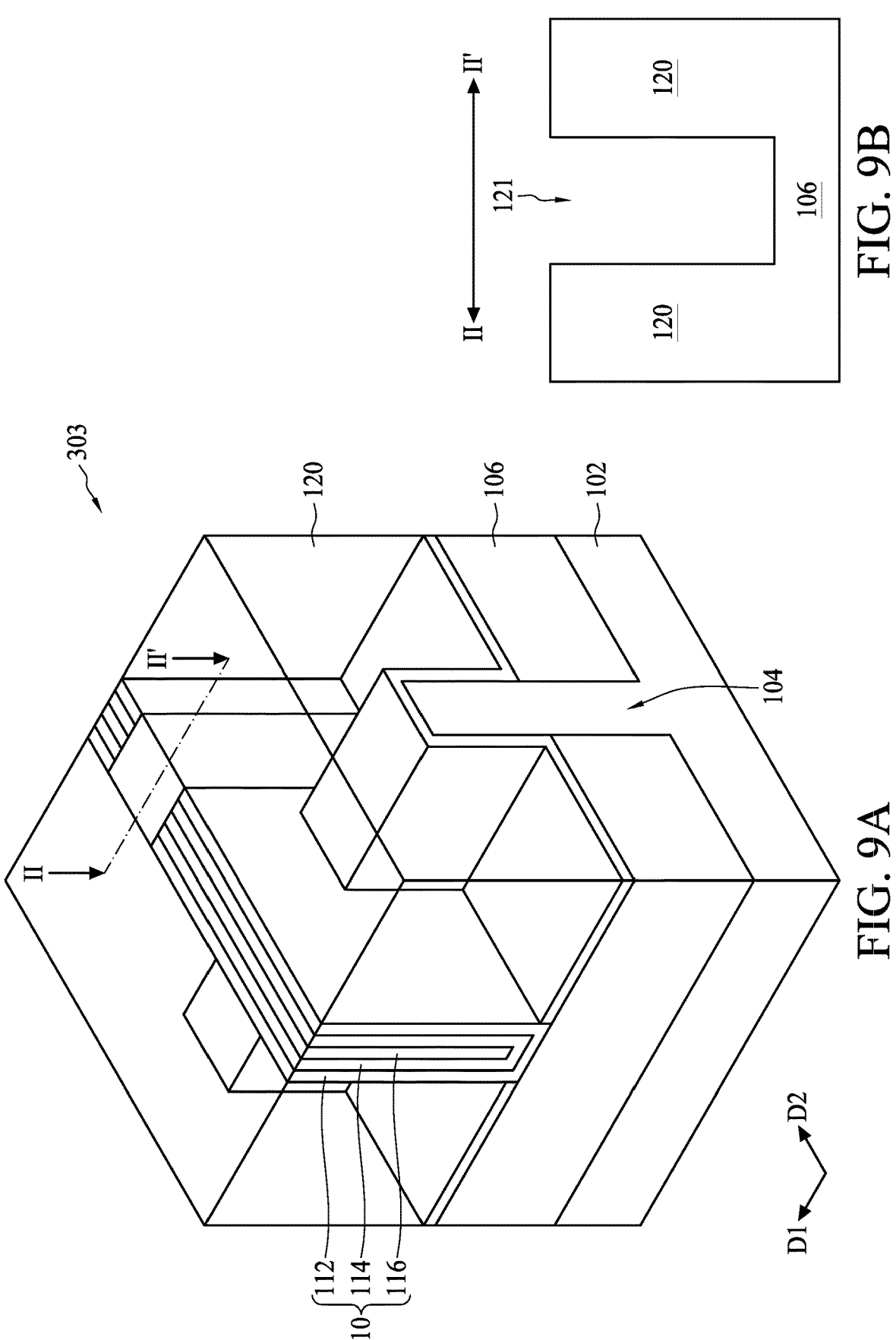
FIG. 9B is a cross-sectional view taken along a line II-II' of FIG. 9A.

In operation 204, a portion of the metal gate structure 110 is removed to form a trench 121. Please refer to FIGS. 9A and 9B, wherein FIG. 9A is a perspective view of an intermediate semiconductor structure 303 according to some embodiments corresponding to operation 204, and FIG. 9B is a cross-sectional view taken along line II-II' of FIG. 9A. In some embodiments, the trench 121 can be formed between fins 104, thus exposing the isolation structure 120 through the trench 121. In some embodiments, the isolation structure 120 may be referred to as sidewalls of the trench 121, while the isolation structure 106 is exposed through the trench 121 and may be referred to a bottom of the trench 121. In other embodiments, the trench 121 can be formed over the fin 104, thereby exposing the isolation structure 120 and a portion of the fin 104. In such embodiments, the isolation structure 120 forms the sidewalls of the trench 121, while the fin 104 forms the bottom of the trench 121.

Figures 10, 11, 12:
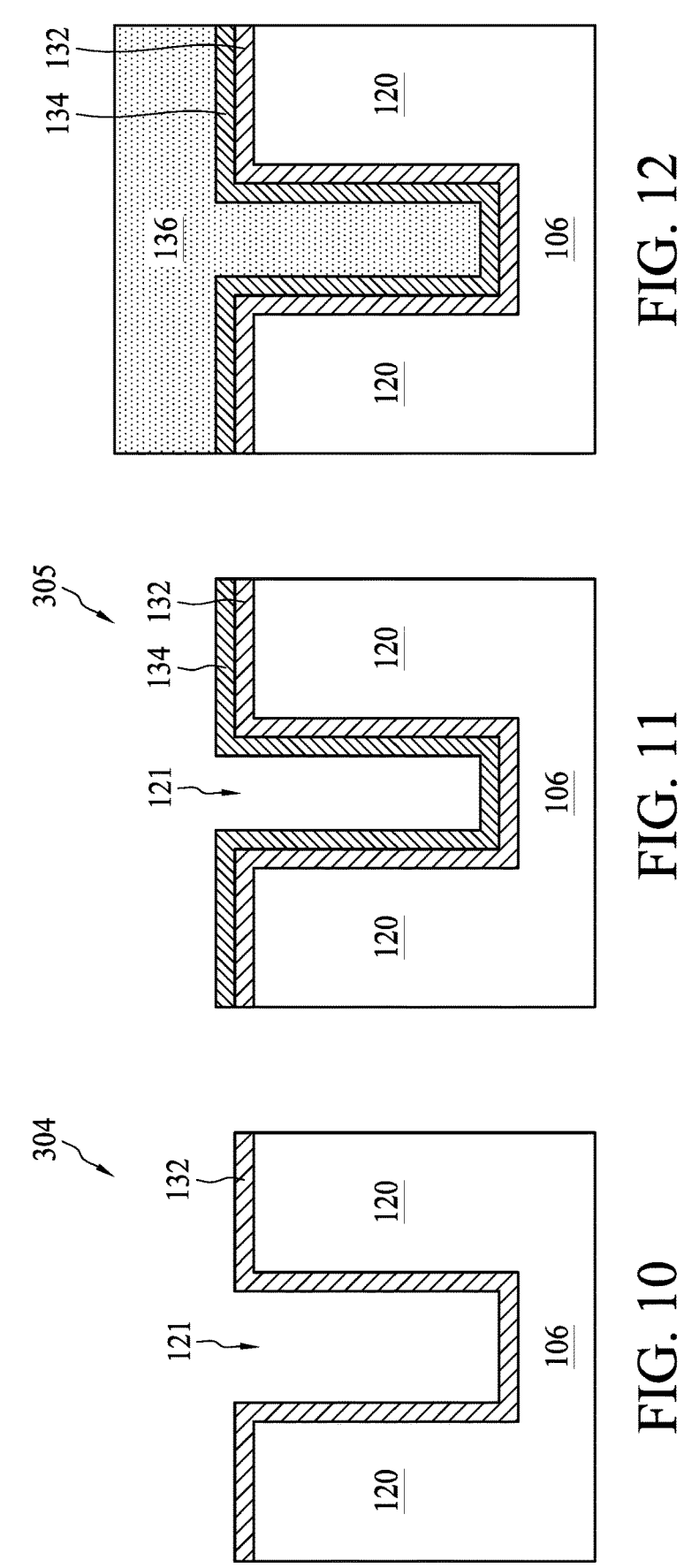
FIGS. 10 to 14 are cross-sectional views at various stages of the method for forming a semiconductor structure according to aspects of the present disclosure.

In operation 206, a first dielectric layer 132 is formed in the trench 121. Referring to FIG. 10, which is a cross-sectional view of a portion of an intermediate semiconductor structure 304 corresponding to operation 206, the first dielectric layer 132 may be conformally formed in the trench 121. In some embodiments, the first dielectric layer 132 includes a dielectric material comprising carbon. For example, the first dielectric layer 132 may be a silicon carbon nitride layer. Further, a carbon concentration in the first dielectric layer 132 may be between approximately 5% and approximately 30%, but the disclosure is not limited thereto. In some embodiments, a thickness of the first dielectric layer 132 is between approximately 1 nanometer and approximately 3 nanometers, but the disclosure is not limited thereto. In some embodiments, the first dielectric layer 132 is formed by a plasma-enhanced chemical vapor deposition (PECVD), but the disclosure is not limited thereto.

In operation 208, a second dielectric layer 134 is formed over the first dielectric layer 132. Referring to FIG. 11, which is a cross-sectional view of a portion of an intermediate semiconductor structure 305 corresponding to operation 208, the second dielectric layer 134 may be conformally formed in the trench 121. The second dielectric layer 134 also includes a dielectric material comprising carbon. In some embodiments, the second dielectric layer 134 includes a dielectric material similar to that of the first dielectric layer 132. In such embodiments, the second dielectric layer 134 includes a silicon carbon nitride layer. However, a carbon concentration in the second dielectric layer 134 is greater than the carbon concentration in the first dielectric layer 132. For example, the carbon concentration in the second dielectric layer 134 may be greater than approximately 30%, but the disclosure is not limited thereto. In such embodiments, the second dielectric layer 134 may be referred to as a C-rich silicon carbon nitride layer. In other embodiments, the second dielectric layer 134 includes a dielectric material different from that of the first dielectric layer 132. In such embodiments, the second dielectric layer 134 may be a carbon layer. In some embodiments, a thickness of the second dielectric layer 134 is between approximately 1 nanometer and approximately 3 nanometers, but the disclosure is not limited thereon.

In operation 210, a third dielectric layer 136 is formed over the second dielectric layer 134. Referring to FIG. 12, which is a cross-sectional view of a portion of an intermediate semiconductor structure 306 corresponding to operation 210, the trench 121 is filled with the third dielectric layer 136. The third dielectric layer 136 also includes a dielectric material comprising carbon. In some embodiments, the third dielectric layer 136 includes a dielectric material different from those of the first dielectric layer 132 and the second dielectric layer 134. For example, the third dielectric layer 136 includes a silicon carbon oxide layer. Further, a carbon concentration in the third dielectric layer 136 is greater than those in the first dielectric layer 132 and the second dielectric layer 134. For example, the carbon concentration in the third dielectric layer 136 is between approximately 50% and approximately 60%, but the disclosure is not limited thereto.

Figure 13:
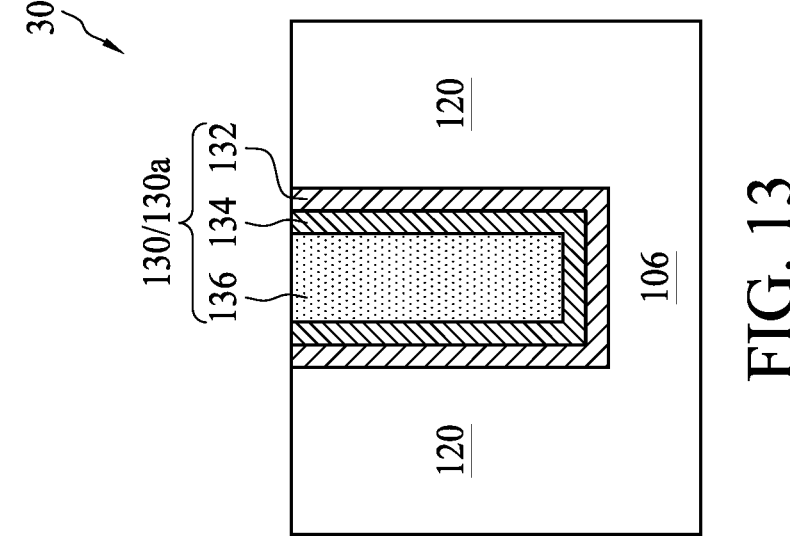

In operation 212, superfluous portions of the first dielectric layer 132, the second dielectric layer 134 and the third dielectric layer 136 are removed to form an isolation structure 130. Referring to FIG. 13, which is a cross-sectional view of a portion of an intermediate semiconductor structure 307 corresponding to operation 212, a top surface of the isolation structure 130 is aligned or level with the top surface of the isolation structure 120. In some embodiments, the first dielectric layer (e.g., the silicon carbon nitride layer) 132, the second dielectric layer (e.g., the C-rich silicon carbon nitride layer) 134 and the third dielectric layer (e.g., the silicon carbon oxide layer) 136 form a tri-layered isolation structure 130a. Accordingly, a dielectric constant of the isolation structure 130a is reduced due to carbon.

Figure 14:
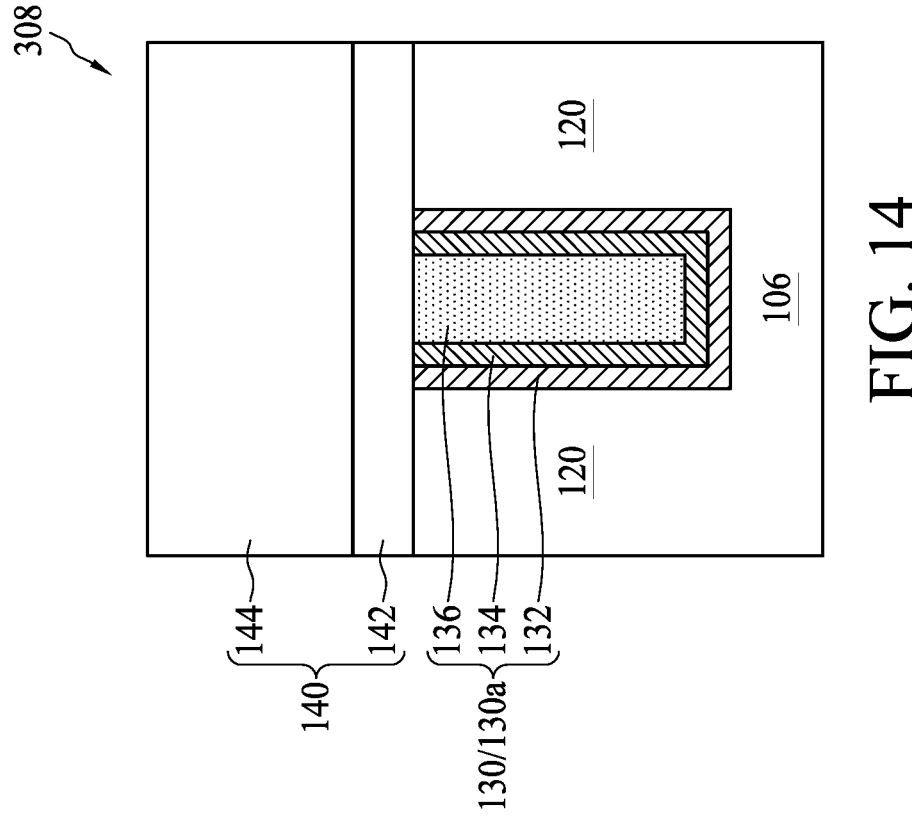

In operation 214, an isolation structure 140 is formed over the isolation structure 130a. Referring to FIG. 14, which is a cross-sectional view of a portion of an intermediate semiconductor structure 308 corresponding to operation 214, the isolation structure 140 is formed over the isolation structure 130a and the isolation structure 120. In some embodiments, the isolation structure 140 includes two dielectric layers 142 and 144. The isolation structure 140 may be similar to those described above; therefore, repeated descriptions are omitted for brevity.

Figures 15, 16:
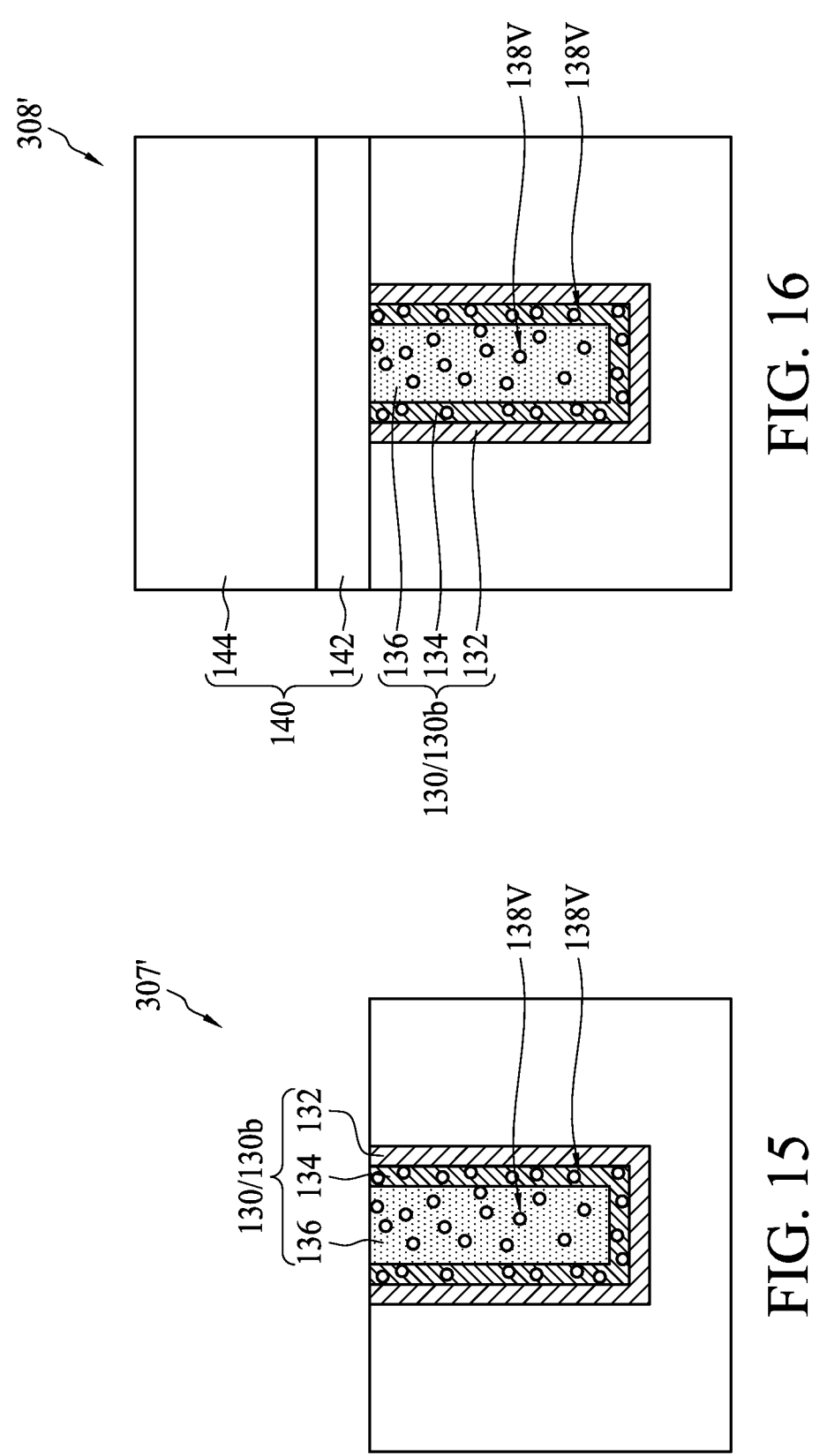
FIGS. 15 and 16 are cross-sectional views at various stages of the method for forming a semiconductor structure according to aspects of the present disclosure.

In some embodiments, other operations may be performed prior to the forming of the isolation structure 140. For example, in operation 213, a plasma treatment is performed on the isolation structure 130. In some embodiments, the plasma treatment includes an oxygen-containing plasma treatment. Referring to FIG. 15, which is a cross-sectional view of a portion of an intermediate semiconductor structure 307' corresponding to operation 213, the O-containing plasma treatment causes the carbon in the second dielectric layer 134 and the carbon in the third dielectric layer 136 to react with oxygen to form carbon dioxide, and the carbon dioxide then degasses from the second dielectric layer 134 and the third dielectric layer 136. In some embodiments, when the second dielectric layer 134 includes silicon carbon nitride, a plurality of voids 138V are formed, and the second dielectric layer 134 is transformed into a porous second dielectric layer 134'. In some embodiments, when the third dielectric layer 136 includes silicon carbon oxide, a plurality of voids 138V are formed, and the third dielectric layer 136 is transformed into a porous third dielectric layer 136'. In such embodiments, the first dielectric layer 132 serves as a barrier layer to impede oxidation. Further, in some embodiments, the first dielectric layer 132 helps to mitigate a metal gate oxidation issue during the performing of the O-containing plasma treatment.

Accordingly, the first dielectric layer 132 (e.g., the silicon carbon nitride layer), the porous second dielectric layer 134' (e.g., the silicon carbon nitride layer), the porous third dielectric layer 136' (e.g., the silicon carbon oxide layer), and the voids 138V form an isolation structure 130b. Further, a dielectric constant of the isolation structure 130b is reduced due to carbon and the voids 138V.

In some embodiments, the operation 214 is performed after the forming of the isolation structure 130b. Referring to FIG. 16, which is a cross-sectional view of a portion of an intermediate semiconductor structure 308' corresponding to operation 214, an isolation structure 140 is formed over the isolation structure 130b and the isolation structure 120. In some embodiments, the isolation structure 140 includes two dielectric layers 142 and 144. The isolation structure 140 may be similar to those described above; therefore, repeated descriptions are omitted for brevity.

Figure 17:
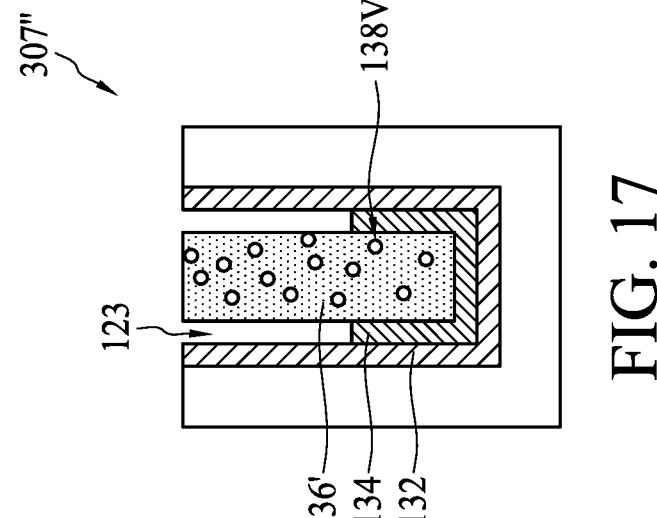

In some embodiments, in operation 213, when the second dielectric layer 134 is a carbon layer and the plasma treatment includes an O-containing plasma treatment, the plasma treatment performed on the isolation structure 130 may consume the second dielectric layer 134. Referring to FIG. 17, which is a cross-sectional view of a portion of an intermediate semiconductor structure 307" corresponding to operation 213, the O-containing plasma treatment causes the carbon in the second dielectric layer 134 and the carbon in the third dielectric layer 136 to react with the oxygen to form carbon dioxide, and the carbon dioxide then degasses from the second dielectric layer 134 and the third dielectric layer 136. In some embodiments, when the second dielectric layer 134 includes a carbon layer, a portion of the second dielectric layer 134 may be removed to form a recess 123. Thus, topmost portion of the second dielectric layer 134 is lowered during the performing of the O-containing plasma treatment. Consequently, the topmost portions of the second dielectric layer 134 is made lower than topmost portions of the first dielectric layer 132. As mentioned above, a plurality of voids 138V are formed, and the third dielectric layer 136 is transformed into a porous third dielectric layer 136'. As mentioned above, the first dielectric layer 132 serves as a barrier layer to impede entry of oxygen and helps to mitigate the metal gate oxidation issue during the performing of the O-containing plasma treatment.

Figure 18:
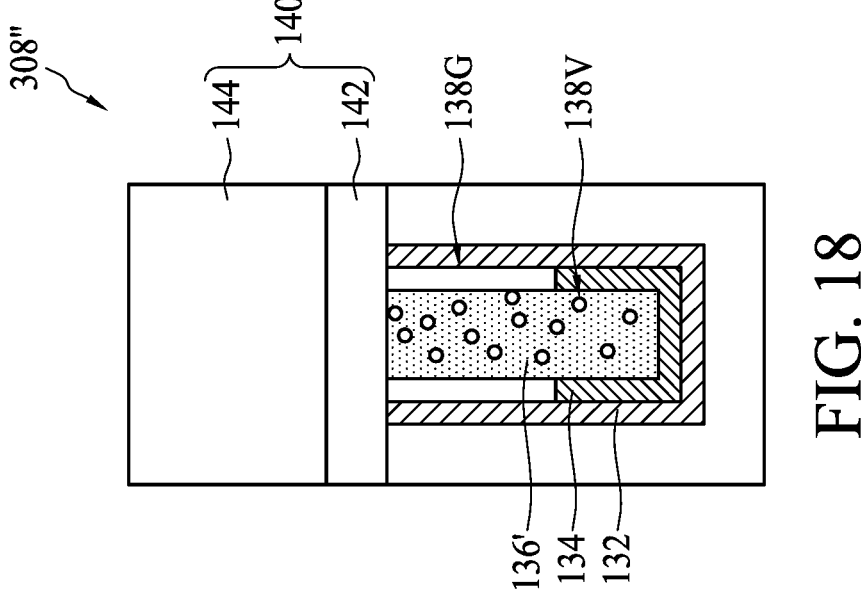
FIGS. 17 and 18 are cross-sectional views at various stages in the method for forming a semiconductor structure according to aspects of the present disclosure.

In operation 214, an isolation structure 140 is formed over the isolation structure 120, the first dielectric layer 132, the second dielectric layer 134 and the porous third dielectric layer 136'. Referring to FIG. 18, which is a cross-sectional view of a portion of an intermediate semiconductor structure 308" corresponding to operation 214, the isolation structure 140 may include two dielectric layers 142 and 144. In some embodiments, the dielectric layer 142 may include silicon nitride, and the dielectric layer 144 may include silicon oxide. In some embodiments, the dielectric layer 142 is formed by a plasma-enhanced chemical vapor deposition (PECVD), and thus the recess 123 is sealed to form at least an air gap 138G, as shown in FIG. 18. After the forming of the dielectric layer 142, the dielectric layer 144 is formed thereon.

Accordingly, the first dielectric layer 132 (e.g., the silicon carbon nitride layer), the second dielectric layer (e.g., the carbon layer) 134, the porous third dielectric layer (e.g., the silicon carbon oxide layer) 136', the voids 138V, and the air gap 138G form a tri-layered hybrid structure 130c. Further, a dielectric constant of the isolation structure 130c is reduced due to carbon, the voids 138V and the air gap 138G.

Additionally, at least a middle-end-of-line (MEOL) connecting structure may be formed in the isolation structure 140 in subsequent operations, though not shown.

Accordingly, a semiconductor structure including a tri-layered isolation structure and a method thereof are provided. The semiconductor structure includes the tri-layered isolation structure that implementing low-k materials in CMG operations. Further, the tri-layered isolation structure may be formed between conductive lines, in a manner known as conductive connecting, in order to reduce Ceff, thereby reducing a RC delay.

According to one embodiment of the present disclosure, a semiconductor structure is provided. The semiconductor structure includes a metal gate structure and an isolation structure adjacent to the metal gate structure. The isolation structure includes a first dielectric layer, a second dielectric layer over the first dielectric layer and a third dielectric layer over the second dielectric layer. The first dielectric layer includes carbon of a first concentration, the second dielectric layer includes carbon of a second concentration, and the third dielectric layer includes carbon of a third concentration. The third concentration is greater than the second concentration, and the second concentration is greater than the first concentration.

According to one embodiment of the present disclosure, a semiconductor structure is provided. The semiconductor structure includes a metal gate structure over a semiconductor substrate, a first isolation structure surrounding the metal gate structure, a second isolation structure disposed in the metal gate structure, and a third isolation structure disposed over the second isolation structure and the metal gate structure. The second isolation structure includes a first dielectric layer, a second dielectric layer and a porous third dielectric layer.

According to one embodiment of the present disclosure, a method for forming a semiconductor structure is provided. The method includes following operations. A metal gate structure and a first isolation structure are formed over a substrate. The first isolation structure surrounds the metal gate structure. A portion of the metal gate structure is removed to form a trench. A first dielectric layer including carbon of a first concentration is formed in the trench. A second dielectric layer including carbon of a second concentration is formed over the first dielectric layer. A third dielectric layer including carbon of a third concentration is formed over the second dielectric layer. Superfluous portions of the first dielectric layer, the second dielectric layer and the third dielectric layer are removed to form a second isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:

forming at least a metal gate structure and a first isolation structure over a substrate, wherein the first isolation structure surrounds the metal gate structure;

removing a portion of the metal gate structure to form a trench;

forming a first dielectric layer comprising carbon of a first concentration in the trench;

forming a second dielectric layer comprising carbon of a second concentration over the first dielectric layer;

forming a third dielectric layer comprising carbon of a third concentration over the second dielectric layer; and removing superfluous portion of the first dielectric layer, the second dielectric layer and the third dielectric layer to form a second isolation structure.

2. The method of claim 1, wherein the third concentration is greater than the second concentration, and the second concentration is greater than the first concentration.

3. The method of claim 1, further comprising performing a plasma treatment to transform the second dielectric layer and the third dielectric layer into a porous second dielectric layer and a porous third dielectric layer, respectively.

4. The method of claim 1, further comprising performing a plasma treatment to remove a portion of the second dielectric layer to form at least a recess in the second isolation structure.

5. The method of claim 4, wherein the performing of the plasma treatment transforms the third dielectric layer into a porous third dielectric layer.

6. The method of claim 4, further comprising forming a third isolation structure over the second isolation structure to seal the recess to form at least an air gap in the second isolation structure.

7. A method for forming a semiconductor structure, comprising:

forming at least a metal gate structure over a substrate;

removing a portion of the metal gate structure to form a trench;

forming a first dielectric layer in the trench;

forming a second dielectric layer over the first dielectric layer in the trench;

forming a third dielectric layer over the second dielectric layer and to fill the trench; and removing superfluous portion of the first dielectric layer, the second dielectric layer and the third dielectric layer to form a first isolation structure, wherein a first carbon concentration of the first dielectric layer, a second carbon concentration of the second dielectric layer and a third carbon concentration of the third dielectric layer are different from each other.

8. The method of claim 7, wherein the third carbon concentration is greater than the second carbon concentration, and the second carbon concentration is greater than the first carbon concentration.

9. The method of claim 7, further comprising performing a plasma treatment to transform the third dielectric layer into a porous third dielectric layer.

10. The method of claim 9, wherein the plasma treatment further transforms the second dielectric layer into a porous second dielectric layer.

11. The method of claim 7, further comprising performing a plasma treatment to remove a portion of the second dielectric layer to form at least a recess in the first isolation structure.

12. The method of claim 11, wherein the performing of the plasma treatment transforms the third dielectric layer into a porous third dielectric layer.

13. The method of claim 11, further comprising forming a second isolation structure over the first isolation structure to seal the recess to form at least an air gap in the first isolation structure.

14. The method of claim 7, further comprising forming a third isolation structure over the substrate, wherein the metal gate structure and the first isolation structure are surrounded by the third isolation structure.

15. The method of claim 7, wherein the substrate comprises a fourth isolation structure formed therein, wherein a portion of the metal gate structure is formed over the fourth isolation structure.

16. A method for forming a semiconductor structure, comprising:

forming at least a metal gate structure a substrate;

removing a portion of the metal gate structure to form a trench;

forming a first dielectric layer comprising carbon of a first concentration in the trench;

forming a second dielectric layer comprising carbon of a second concentration over the first dielectric layer;

forming a third dielectric layer comprising carbon of a third concentration over the second dielectric layer;

performing a plasma treatment to the third dielectric layer to transform the third dielectric layer into a porous third dielectric layer; and removing superfluous portion of the first dielectric layer, the second dielectric layer and the third dielectric layer to form a first isolation structure.

17. The method of claim 16, wherein the third concentration is greater than the second concentration, and the second concentration is greater than the first concentration.

18. The method of claim 16, wherein the plasma treatment further transforms the second dielectric layer into a porous second dielectric layer.

19. The method of claim 16, wherein the plasma treatment is performed to remove a portion of the second dielectric layer to form at least a recess.

20. The method of claim 19, further comprising forming a second isolation structure over the first isolation structure to seal the recess to form at least an air gap in the first isolation structure.

* * * * *